United States Patent [19]

Peters et al.

[11] Patent Number: 5,297,075
[45] Date of Patent: Mar. 22, 1994

[54] COMPUTER CONTROLLED TRANSVERSAL EQUALIZER

[75] Inventors: Richard W. Peters, Algonquin; John G. Christopher, Berkeley; John W. Staples, Buffalo Grove, all of Ill.

[73] Assignee: Knowles Electronics, Inc., Itasca, Ill.

[21] Appl. No.: 919,742

[22] Filed: Jul. 27, 1992

[51] Int. Cl.$^5$ ............................................. G06G 7/02
[52] U.S. Cl. .................................. 364/825; 333/28 T
[58] Field of Search ............... 364/825, 724.20, 724.19, 364/745; 333/28 T, 28 R, 18; 375/11–14

[56] References Cited

U.S. PATENT DOCUMENTS 3,292,110 12/1966 Becker et al. ......................... 333/18
4,566,119 1/1986 Peters ................................... 381/103
5,005,184 4/1991 Amano et al. ......................... 333/18

Primary Examiner—Tan V. Mai
Attorney, Agent, or Firm—Kinzer, Plyer, Dorn, McEachran & Jambor

[57] ABSTRACT

An adjustable equalizer network has a series chain of N all pass amplifier stages driving N+1 scaling circuits connected to a final summing circuit that adjusts the frequency response at M+1 frequency control points to obtain a predetermined ripple free minimum phase shift frequency response over a given frequency range. The scaling circuits have scaling coefficients, of magnitude and sign determined by Fourier analysis and an appropriate truncation function, such that the filter has a pass band representative of M+1 contiguous bands conjointly encompassing the frequency range. Calculation of the scaling coefficients and control of the scaling circuits is accomplished through digital computation and manipulation. Some embodiments may use passive circuits or linear analogue circuits as scaling circuits, controlled manually or by a computing device.

4 Claims, 2 Drawing Sheets

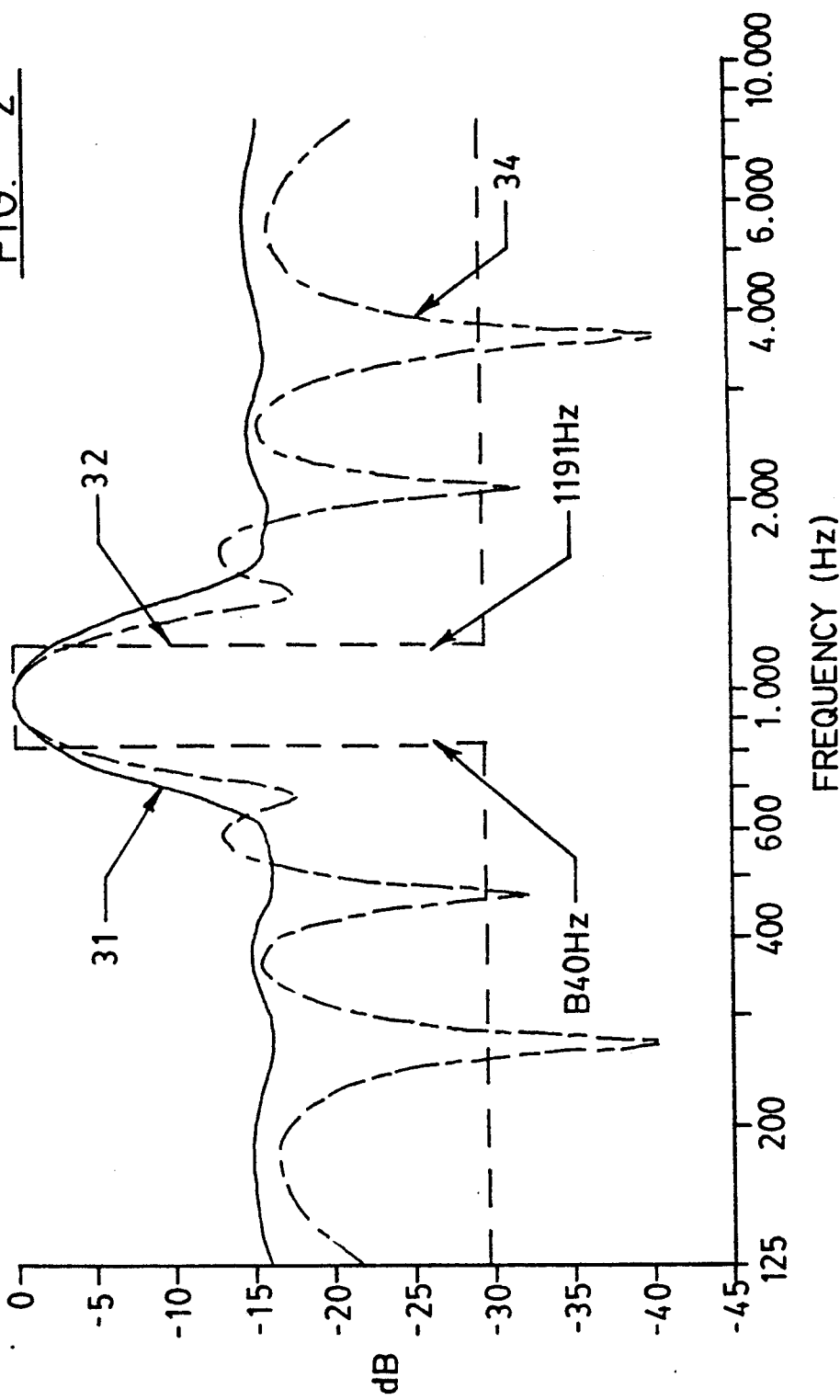

COMPUTER CONTROLLED TRANSVERSAL EQUALIZER

BACKGROUND OF THE INVENTION

This invention is an improvement on the equalizer networks and methods of developing scaling coefficients therefor of Peters U.S. Pat. No. 4,566,119, which defines an equalizer and discusses implementations thereto, specifically, Davis, Weiner and Lee, and Tattersall, describing the shortcomings of each. The equalizer networks described in U.S. Pat. No. 4,566,119 are based on a set of minimum phase transversal filters derived from a single active element all pass chain, each of the filters consisting of the summation of scaling circuit outputs from the all pass chain, the outputs of the filters being scaled and summed to provide the adjustable equalizer realization. An equalizer as described thus offers virtually ripplefree frequency response with minimal interaction from band to band and a reasonable approximation of the desired frequency response. It was stated in U.S. Pat. No. 4,566,119 that calculations involving both the real and imaginary components of the Fourier series were unwieldy and indeed "virtually impossible" due to a non-linear relationship between the frequency response and the scaling coefficients. Thus a linear approximation to the requested frequency response, calculated only from the real component of the series, was implemented.

While the method disclosed in U.S. Pat. No. 4,566,119 is of great utility, it is subject to some shortcomings. The method of determining the scaling coefficients produces a linear approximation to the real part of the desired frequency response and forces the imaginary part to follow by imposing minimum phase constraints. Hence, the selectivity (Q) of the equalizer filters is compromised. In addition, the method used forces equal errors in the pass band and stop band when measured arithmetically, resulting in response curves which are not reciprocal (mirror image) in stop band (cut) and pass band (boost) response when measured in decibels.

SUMMARY OF THE INVENTION

This invention impacts upon the method of determining the scaling coefficients for the equalizer networks. The improvements overcome the above-mentioned shortcomings without compromising any of the unique features of the patent. Shown herein is the method of determining the scaling coefficients, which requires a digital computing device to solve the non-linear relationships between scaling coefficients, based upon the log magnitude of the desired frequency response, thereby including both the real and imaginary components in the Fourier approximation. Minimum phase shift is preserved by requiring a minimum phase relationship between the real and imaginary components of the desired frequency response. An equalizer network whose scaling coefficients are determined by this method will exhibit response curves which are reciprocal in cut and boost response when measured in decibels, and have higher selectivity (Q) than those of U.S. Pat. No. 4,566,119.

It is an object of the present invention, therefore, to provide a new and improved method for the generation of scaling coefficients to establish virtually any desired frequency response in a Fourier transform minimum phase shift equalizer network operable over a broad frequency range such as the audio frequency range with minimum response ripple.

Another object of the invention is to provide a new and improved equalizer network of the minimum phase shift type that is highly stable in operation, that exhibits little or no ringing from individual stages of the network, and that provides for smooth truncation to minimize or eliminate "Gibbs phenomenon" errors.

A further object of the invention is to provide a new and improved minimum phase shift equalizer network, utilizing a single chain of all pass operational amplifier stages, that can be quickly and accurately modified to accommodate changing system frequency response requirements by changing control signals applied to the equalizer network while preserving the aforementioned characteristics of minimum ripple, no ringing, stable operation, and smooth truncation.

Another object of the invention is to provide a new and improved method of determining the circuit parameters for a minimum phase shift equalizer network, based on a single chain of all pass operational amplifier stages, that allows for the use of a single simple scaling resistance for each all pass stage output in the network chain and summing means to complete an equalizer network.

Accordingly, in one apparatus embodiment the invention relates to a scaling control signal generator for generating a series of scaling control signals for a simplified equalizer network comprising a series chain of N all pass delay stages having an initial output tap connected to the input to the first stage in the chain and N additional output taps each connected to the output of a succeeding stage in the chain, N+1 scaling circuits each connected to one of the output taps, each scaling circuit including a multiplying digital to analog convertor for multiplying an input signal from the associated chain output tap by a digital scaling control signal indicative of a scaling coefficient, in which M+1 frequency control points afford the predetermined frequency response characteristic over the pre-selected frequency range, and summing circuit means for additively combining the outputs of all of the scaling circuits to develop the equalized output signal. The scaling control signal generator comprises a digital computer and software for receiving a series of attenuation numbers, expressed in decibels, $H_O$ through $H_M$ conjointly representative of the frequency response characteristic of the equalizer network in accordance with the relationship $$H(\theta) = \sum_{n=0}^{N} a_n W(n) e^{-in\theta}$$

to generate a series of digital scaling control signals each representative of the scaling coefficient for one scaling circuit in the equalizer network based on the series $$a_0 = \exp(b_0) \quad \text{for } n = 0$$

$$a_n = 2 \sum_{k=1}^{n} \frac{k}{n} b_k a_{(n-k)} \quad \text{for } n > 0$$

where $b_k$ is representative of the Fourier function series $$b_0 = \Sigma_m \frac{H_m}{\pi} (\theta_{m+1} - \theta_m) \quad \text{for } n = 0$$

-continued $$b_n = \Sigma_m \frac{H_m}{n\pi}(\sin n\theta_{m+1} - \sin n\theta_m) \text{ for } n > 0$$

and n is the number of one stage in the all pass chain. The definition and import of the above equations are described herein.

BRIEF DESCRIPTION OF THE DRAWINGS

FIG. 2 comprises a series of frequency response charts utilized in explaining operational characteristics for the circuit of FIG. 1 when functioning as a band pass filter.

DETAILED DESCRIPTION OF THE INVENTION

Figure 1:
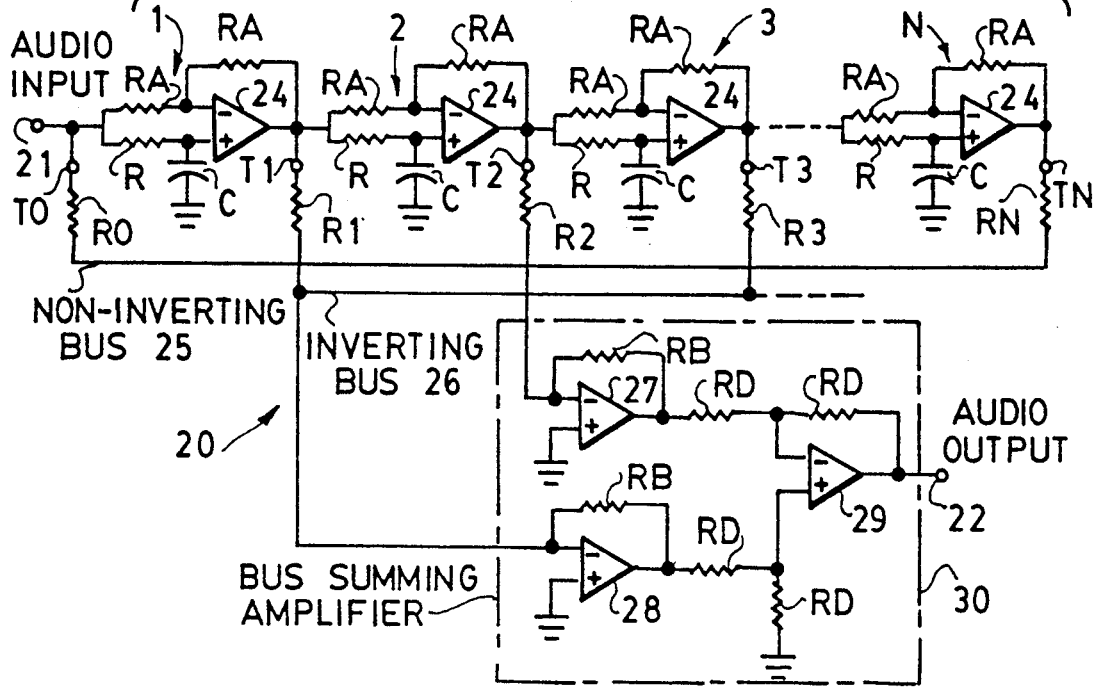
FIG. 1 is a simplified schematic circuit diagram of a network which, when provided with appropriate scaling circuit parameters, affords a minimum phase shift equalizer constructed in accordance with one embodiment of the present invention.

FIG. 1 illustrates a network 20 that incorporates circuit parameters effective to complete a minimum phase shift equalizer network affording virtually any desired frequency response characteristic with minimum ripple over a broad frequency range, typically the audio range.

Network 20 has an audio input terminal 21 and an audio output terminal 22. Input terminal 21 is connected to a series chain 23 of N all pass delay stages; all stages in chain 23 incorporate the same circuit parameters. The first stage 1 in chain 23 includes an operational amplifier 24 having its noninverting input connected to the audio input terminal 21 by a circuit including a series resistance R and a shunt capacitance C. The inverting input of operational amplifier 24 is connected to the audio input terminal 21 by a series resistance RA; the output of the operational amplifier is connected back to its inverting input through a corresponding resistance RA. The output of amplifier 24 in stage 1 constitutes the input for stage 2. The output of the amplifier 24 in stage 2 provides the input to stage 3, and so on down the chain to stage N. The number of stages N in the series chain 23 may vary substantially, depending upon overall system requirements.

An initial output tap T0 is connected to input terminal 21, the input for the first stage in the all pass delay chain 23. Network 20 further includes N additional output taps T1, T2, T3, ..., TN each connected to the output of the operational amplifier 24 of a succeeding stage in the chain. Thus, tap T1 is connected to the output of the amplifier 24 in stage 1, tap T2 is at the output of the amplifier in stage 2, and so on.

An initial scaling circuit is connected to the initial output tap T0 of the series chain 23 of all pass delay stages. In network 20, the initial scaling circuit comprises a resistor R0 that connects tap T0 to a non-inverting bus 25. Network 20 further includes N additional scaling circuits, each comprising a resistor (R1 ... RN) connecting one of the taps T1 through TN to the non-inverting bus 25 or to an inverting bus 26. The basis for selection of the bus connections for the scaling circuit resistors R1 through RN is described hereinafter.

Network 20, FIG. 1, further includes a summing circuit 30 for additively combining the outputs of all of the scaling circuits comprising resistors R0 through RN to develop an output signal having a predetermined frequency response characteristic. Summing circuit 30 includes an operational amplifier 27 having its inverting input connected to the non-inverting bus 25. The non-inverting input to amplifier 27 is connected to system ground; a negative feedback resistor RB connects the output of amplifier 27 back to its inverting input. Another operational amplifier 28 is connected in a similar circuit arrangement except that its inverting input is connected to inverting bus 26. The outputs of amplifiers 27 and 28 are individually connected, through two series resistors RD, to the inverting and non-inverting inputs, respectively, of another operational amplifier 29 utilized as a summing amplifier. The non-inverting input to amplifier 29 is returned to system ground through another resistor RD. The output of amplifier 29, which is connected to the audio output terminal 22 of network 20, is connected through a feedback resistor RD to the inverting input of the amplifier.

The network 20, illustrated in FIG. 1, may be made to produce different frequency response characteristics by varying the magnitude of the scaling resistances R0 through RN and by changing the connections of the individual scaling resistors to buses 25 and 26.

Each all pass stage in chain 23 has the property of passing all frequencies over a wide range with unity gain; hence the derivation of the term "all pass". However, each delay stage in chain 23 produces a phase shift $\theta$ in any signal of any frequency $f$, within the operational range, where $$\theta = 2\tan^{-1}(2\pi f RC) \qquad (1)$$

Thus, the response of each stage 1 through N in chain 23 is simply a phase shift factor $e^{-i\theta}$. The accumulated phase shift, from the first output tap T0 to the final output tap TN in chain 23, is $N\theta$ and the phase shift factor is $e^{-iN\theta}$. The output of each of the all pass delay stages 1 through N contributes to the final output of network 20 through the scaling of weighting circuits for each stage, provided by the resistances R0 through RN. In the bus summing amplifier circuit 30, amplifiers 27 and 28 convert the total current from buses 25 and 26, respectively to voltages. Those voltages are then additively combined (subtracted) in the output stage 29 of the summing circuit 30.

The overall frequency response $H(\theta)$ of network 20, FIG. 1, is $$H(\theta) = \sum_{n=0}^{N} a_n W(n) e^{-in\theta} \qquad (2)$$

in which $a_n$ represents the scaling coefficient for any stage n in chain 23, determined by $$a_n W(n) = \pm RB/R_n \qquad (2)$$

where $R_n$ is the scaling resistance for stage n. The polarity of the scaling coefficient $a_n$ for any tap in chain 23 determines whether the scaling circuit resistance (R0 through RN) for that tap is connected to the non-inverting bus 25 or to the inverting bus 26.

Curve 31 in FIG. 2 illustrates a band pass filter response, based on an idealized characteristic 32, that may be obtained with the network 20, FIG. 1, when the circuit parameters for the individual stages of chain 23 are R=10 kilohms, C=0.015 microfarads, and N=16, using scaling coefficients calculated in accordance with the following relationships:

$$a_0 = \exp\left(\frac{H_M}{\pi}(\theta_{m+1} - \theta_m)\right) \text{ for } n = 0 \quad (3)$$

$$a_n = 2\sum_{k=1}^{n} \frac{H_m}{n\pi} a_{(n-k)}(\sin k\theta_{m+1} - \sin k\theta_m) \text{ for } n > 0 \quad (3)$$

in which $\theta_{m+1}$ and $\theta_m$ are upper and lower frequency limits according to relationship (1) above. The curves in FIG. 2 have been normalized to give a response of 0 dB at 1000 Hz. For characteristics 31 and 32, FIG. 2, the center frequency is 1000 Hz. The formulas (3) assume an ideal band pass 32 expanded in a Fourier series. If the series were continued to $N=\alpha$, then the idealized response of curve 32 would be obtained. However, by truncating the Fourier series at a finite value (e.g., N=16), the result is a frequency response curve as indicated by dash line 34. Curve 34 illustrates the "Gibbs phenomenon" at the edges of the pass band.

The overshoot and undershoot of curve 34 can be reduced by gradually reducing the scaling coefficients for the individual stages of network 20 toward zero as n increases. This is the significance of the expression W(n) in equation (2). A preferred formula for the weighting function W(n) is $$W(n) = 0.54 + 0.46\cos\frac{\pi n}{N} \quad (4)$$

This is the Hamming weighting function, and results in conversion of the distorted characteristic of curve 34 to the frequency response characteristic of curve 31 (FIG. 2). To complete this description of utilization of network 20, FIG. 1, as a band pass filter, it may be noted that the phase shifts $\theta_{m+1}$ and $\theta_m$ based upon the upper and lower frequencies of the pass band represented by the ideal curve 32 in FIG. 2, are given by relationship (1) as $\theta_m = 1.339$ radians (at 840 Hz), and
$\theta_{m+1} = 1.686$ radians (at 1191 Hz).

Figure 3:
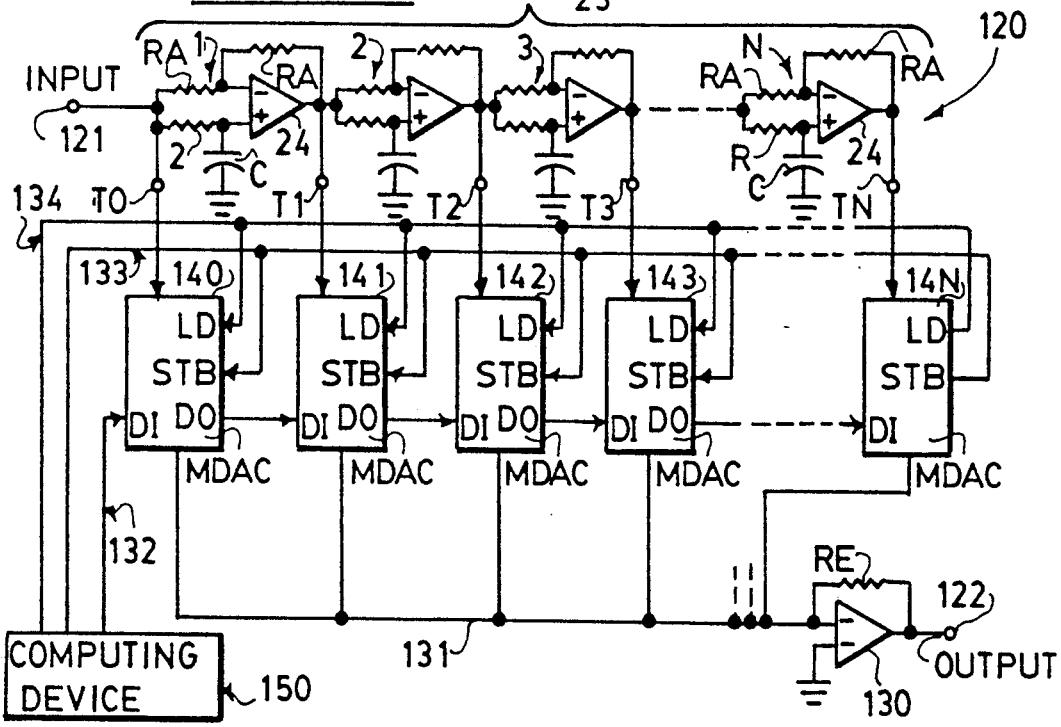
FIG. 3 is a schematic diagram of an equalizer network constituting another embodiment of the present invention.

FIG. 3 illustrates an equalizer network 120 constructed in accordance with another embodiment of the invention. Equalizer 120 is similar in many respects to network 20 (FIG. 1) when employed as an equalizer network; however, the scaling circuits and summing circuit have been substantially modified.

Equalizer network 120 has an input terminal 121 and an output terminal 122. Input terminal 121 is connected to the first stage of a chain 23 of N all pass delay stages, again shown as all pass operational amplifier stages each including an operational amplifier 24. As before, each stage has a series resistance R and shunt capacitance C providing an input to the non-inverting input of the operational amplifier, with a series resistance RA as the inverting input to the amplifier and a negative feedback circuit of resistance RA. Also as before, chain 23 is provided with an initial output tap T0 connected to input terminal 121 and a series of N additional output taps T1 through TN each connected to the output of one of the amplifier stages.

In equalizer network 120, the initial scaling circuit connected to tap T0 is a multiplying digital to analogue converter (MDAC) 140. The signal input to MDAC 140 is the voltage from tap T0 of chain 23. A current output from MDAC 140 is supplied to the inverting input of an operational amplifier 130 which serves as a summing circuit for network 120.

The scaling circuits connected to the remaining taps T1 through TN in equalizer network 120 each incorporate a multiplying digital to analogue converter. Thus, MDAC 141 receives an input from tap T1 in chain 23 and has a signal output connected to the bus 131 that is used as an input to amplifier 130. The MDACs 140 through 14N are each connected to one of the taps T2 through TN.

Network 120 further includes a data bus 132 connected to a series chain of N+1 MDACs. Data bus 132 is connected to the digital data shift register input (DI) of MDAC 140. The digital output (DO) of MDAC 140 is connected to the DI of MDAC 141, and so on down to MDAC 14N. A CLOCK bus 133 and a WRITE bus 134 are connected to the STB and LD inputs, respectively, of each of the MDAC circuits.

In network 120, each MDAC functions as a settable resistance, the magnitude of that resistance for each MDAC being determined by a digital word supplied to the MDAC from data bus 132 via a sequence of serial digital words, each identifying the magnitude of resistance and the polarity of output required for a given MDAC. Bus 133 supplies STROBE command signal (STB) to each MDAC allowing the data on bus 132 to be moved sequentially one bit at a time, down the chain of MDACs 140 through 14N. When all MDACs have the necessary data, bus 134 supplies a LOAD command signal (LD) to enable each MDAC to record the digital data provided to their shift registers by bus 132. Each MDAC retains its setting data in an internal register until such time as a change may be effected by a change of the signals on the data bus, strobed to the correct MDAC position, and enabled with the LOAD command signal. A suitable MDAC circuit of this kind is manufactured by Precision Monolithics, Inc., Model DAC-8143.

In the operation of equalizer network 120, each scaling circuit MDAC receives a signal input constituting the voltage from the tap (T0 ... TN) of the all pass amplifier chain 23 to which the MDAC is connected. The signal output from each MDAC, on bus 131, is a current containing all of the frequency components of the input signal and having an amplitude determined by the data set into the MDAC through the digital control signals supplied from data bus 132, coordinated by information from bus 133 and recorded by a signal on bus 134. For some of the MDACs, the output is inverted; the output polarity is also determined by the digital control signal supplied from data bus 132. All of the output signals from the scaling circuits comprising the MDACs 140 through 14N are additively combined in the summing amplifier circuit 130, producing an equalized output signal at terminal 122 that has a frequency response characteristic determined by the digital data control signals from bus 132.

Thus, network 120, when provided with the requisite information from data bus 132, functions to afford a minimum phase shift equalizer network with minimum ripple, no ringing from individual stages, stable operation, and smooth truncation. Unlike network 20 of FIG. 1, when employed as an equalizer, network 120 (FIG. 3) can be adjusted to conform to varying system requirements. Of course, to utilize the frequency response adjustment characteristics of network 120, it is necessary to provide a source of appropriate control signals on data bus 132; a digital computer 150 and the appropriate software are effective for this purpose.

In the equalizer illustrated in FIG. 3 the computer 150 sends a series of data bits to the MDACs 140 through 14N. The computer 150 is a commercially available IBM PC/AT or equivalent physically removed from the equalizer network 120 and connected via a parallel connection from the equalizer to a commercially available add-in product, a parallel digital Input/Output board such as a Kiethley/Metrabyte PIO-96. An alternative embodiment would use existing technology to communicate between the computing device 150 and the network 120 via an industry standard such as RS-232 utilizing available hardware and using sequencing and protocol software such as is currently prior art. Another embodiment physically locates the computing device 150 within the package of the equalizer network 120, allowing coefficient calculations to be performed either locally, or calculated remotely in a separate computer and transmitted by aforementioned and currently available technology to the captive computing device for distribution to the specific MDACs in order to set the tap weighting coefficients. An alternative embodiment groups the MDACs into several serial strings so that data may be passed serially down each string simultaneously to improve speed or performance. Another embodiment uses MDACs in which the digital control words are loaded via a parallel data bus, each MDAC being separately addressed so as to accept its own specific control word.

In the embodiment illustrated in FIG. 3 the software controlling the computer 150 uses currently and commercially available language compilers such as Microsoft C for development of the programs incorporating the algorithms to calculate the tap coefficients to be set into the MDACs, arrange the data bits so that the MDACs will receive their specific data correctly, and send that data to the network MDACs 140 through 14N. Additional software uses the same mathematical basis to calculate the predicted behavior of the equalizer network to provide this information to the user of the equalizer.

Starting with the desired frequency response $$D(\theta) = |D(\theta)| e^{i\phi(\theta)} \quad (5)$$

wherein the relationship between $\theta$ and frequency $f$ is given in (1), it follows that:

$$lnD(\theta) = ln|D(\theta)| + i\phi(\theta) \quad (6)$$

Furthermore, if $ln|D(\theta)|$ is defined as a series:

$$ln|D(\theta)| = \sum_{n=-\infty}^{\infty} b_n e^{-in\theta} \quad (7)$$

then, by inverse Fourier transform it follows that:

$$b_n = \frac{1}{2\pi} \int_{-\pi}^{\pi} ln|D(\theta)| e^{in\theta} d\theta \quad (8)$$

Equation (8) shows that, given the desired response $D(\theta)$, the coefficients $b_n$ can be calculated by methods of Fourier analysis. In equation (8) since $ln|D(\theta)|$ must be an even function, it follows that:

$$b_n = \frac{1}{\pi} \int_0^{\pi} ln|D(\theta)| \cos n\theta \, d\theta \quad (9)$$

If $ln|D(\theta)|$ is defined by a group of attenuation values $H_m$, with each setting valid over the frequency band ranges for an equalizer network like network 120 of FIG. 3, and each $H_m$ is valid from $\theta_m$ to $\theta_{m+1}$, then the following relationships result:

$$b_0 = \Sigma_m \frac{H_m}{\pi} (\theta_{m+1} - \theta_m) \quad \text{for } n = 0 \quad (10)$$

$$b_n = \Sigma_m \frac{H_m}{n\pi} (\sin n\theta_{m+1} - \sin n\theta_m) \quad \text{for } n > 0 \quad (10)$$

From properties of the Hilbert and Fourier transforms shown in Oppenheim and Schafer, *Digital Signal Processing*, pp. 337–345, it can be shown that:

$$lnD(\theta) = b_0 + 2 \sum_{n=1}^{\infty} b_n e^{-in\theta} \quad (11)$$

and therefore $$D(\theta) = \exp\left[ b_0 + 2 \sum_{n=1}^{\infty} b_n e^{-in\theta} \right] \quad (12)$$

The unwindowed response of the equalizer is given by:

$$H(\theta) = \sum_{n=0}^{\infty} a_n e^{-in\theta} \quad (13)$$

Comparing the actual unwindowed response of the equalizer network, of equation (13), to the desired response, of equation (12), using the exponential series expansion and properties of the complex cepstrum associated with minimum phase systems shown in Oppenheim and Schafer, *Digital Signal Processing*, pp. 494–506, it can be shown from equations (2) and (13) that:

$$H(\theta) = D(\theta) \text{ when,} \quad (14)$$

$$a_0 = \exp(b_0) \quad \text{for } n = 0$$

$$a_n = 2 \sum_{k=1}^{n} \frac{k}{n} b_k a_{(n-k)} \quad \text{for } n > 0$$

Since it is impossible to build an infinitely long all pass chain, the series given in equation (13) above is truncated at N taps by the multiplication of the unwindowed equalizer response from equation (13) by a windowing function $W(n)$, as given by equation (4), from which results the actual response of the equalizer given by equation (2).

The number of stages required in all pass chain 23, for either of the previously described embodiments of the invention, may be determined approximately in accordance with the relationship:

$$N \approx \frac{\pi f_0}{k_L} \approx \frac{\pi f_H}{f_0}$$

in which:

$f_O = \frac{1}{2}\pi RC$ $f_L$ is the lower limit of the frequency range,
$f_H$ is the upper limit of the frequency range,
$f_H f_L = f_O^2$, and
RC is the time constant of each delay stage.
Thus, if
$f_O = 1$ KHz (R=10 Kilohms, C=0.015 microfarads),
$f_L = 100$ Hz, and
$f_H = 10$ KHz, then
N=32 stages;
for $f_L = 200$ Hz and $f_H = 5$ KHz, N=16 stages.

For equalizer networks, such as network 20 of FIG. 1 and network 120 of FIG. 3, it is preferred that $$M \leq N/2.$$

In summary, the transversal filter of the present invention results from an initial analysis based on a series of rectangular prototype (real and even) filters, as discussed above in connection with FIG. 2, enabling calculation of a basic set of scaling resistors and polarities for an equalizer like FIG. 1 or the digital coefficients for an adjustable equalizer as in FIG. 3. These scaling values are further weighted by a smooth truncating function, such as, but not limited to, the Hamming function, to avoid filter overshoot known as the "Gibbs phenomenon". A complete set of contiguous frequency control bands can thus be devised to cover a broad frequency range, such as the entire audio range.

The equalizer networks, illustrated in FIGS. 1 and 3, produce minimum phase shift response. The combination of frequency bands produce a ripple free frequency response characteristic; that is, in the regions where adjacent frequency bands overlap no individual frequency band stands out as a bump or dip in the overall equalizer frequency response. The transient response of the equalizer shows complete cancelling of ringing of individual frequency bands such that the equalizer network is free of excessive ringing over all. Furthermore, the filter is stable because only first order non-resonant circuits are employed.

For systems having fixed frequency response characteristics it is possible to use equalizer network 20 (FIG. 1) as the basis for producing greatly simplified low cost equalizers having response characteristics precisely tailored to virtually any requirements. Those equalizers, despite their simplicity of construction, as is evident from FIG. 1, afford stable, minimum phase shift frequency response characteristics having minimum ripple with no ringing from individual stages and with smooth truncation effectively eliminating "Gibbs phenomenon" errors.

For persons skilled in the art of digital filters and synthesis of filters by orthonormal functions, it will be apparent that the all pass amplifier chain 23 used in the embodiments of the invention can be replaced with a chain of pure time delay elements or with circuits described by the exponential, LaGuerre polynomial, and LeGendre polynomial functions, as well as the Fourier series employed herein. The Fourier series technique is preferred for its simple realization, using first order all pass amplifier stages as shown. Time delay elements provided by charge coupled devices or digital delay systems currently lack the highly advantageous attributes of simplicity, performance, and cost achieved with the all pass stages as shown in the drawings. The circuit elements required for the exponential and LeGendre functions are not uniform from stage to stage and impose considerable additional circuit complexities. The LaGuerre functions, on the other hand, can be shown to be a simple generalization of the Fourier method described herein and afford no particular advantages.

We claim:

1. A minimum-phase equalizer network adapted to develop an equalized output signal having a predetermined frequency response characteristic with minimum ripple, over a preselected frequency range, comprising:
    a series chain of N all pass delay stages, the chain having an initial tap connected to the input to the first stage in the chain and N additional taps each connected to the output of a succeeding stage in the chain;
    N+1 scaling circuits, each connected to one of the taps, each scaling circuit having a scaling coefficient based on the log magnitude of the desired frequency response; and
    summing circuit means for additively combining the outputs of all of the scaling circuits to develop the equalized output signal.

2. An equalizer network according to claim 1 in which M+1 frequency control points afford the predetermined frequency response characteristic over the pre-selected frequency range.

3. An equalizer network according to claim 1 wherein the scaling coefficient for one scaling circuit in the equalizer network is based on the series $$a_0 = \exp(b_0) \quad \text{for } n = 0$$

$$a_n = 2 \sum_{k=1}^{n} \frac{k}{n} b_k a_{(n-k)} \quad \text{for } n > 0$$

where $b_k$ is representative of the Fourier function series $$b_0 = \Sigma_m \frac{H_m}{\pi} (\theta_{m+1} - \theta_m) \quad \text{for } n = 0$$

$$b_n = \Sigma_m \frac{H_m}{n\pi} (\sin n\theta_{m+1} - \sin n\theta_m) \quad \text{for } n > 0$$

and n is the number of one stage in the all pass chain.

4. An equalizer network according to claim 1 in which the summing circuit means comprises:
    a non-inverting bus to which all scaling circuits having positive scaling coefficients are connected;
    an inverting bus to which all scaling circuits having negative scaling coefficients are connected; and
    a summing amplifier for adding signals from the two buses together, with the signals from one bus inverted relative to the signals from the other bus.

* * * * *